United States Patent
Motwani

(10) Patent No.: US 10,908,996 B2
(45) Date of Patent: Feb. 2, 2021

(54) DISTRIBUTION OF A CODEWORD ACROSS INDIVIDUAL STORAGE UNITS TO REDUCE THE BIT ERROR RATE

(71) Applicant: Intel Corporation, Santa Clara, CA (US)

(72) Inventor: Ravi Motwani, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/282,725

(22) Filed: Feb. 22, 2019

(65) Prior Publication Data

US 2019/0188073 A1  Jun. 20, 2019

(51) Int. Cl.
*G06F 11/10* (2006.01)
*H03M 13/39* (2006.01)
(Continued)

(52) U.S. Cl.
CPC ........ *G06F 11/108* (2013.01); *G06F 11/1004* (2013.01); *G06F 11/1044* (2013.01);
(Continued)

(58) Field of Classification Search
CPC ............... G06F 11/108; G06F 11/1048; G06F 11/1044; G06F 11/1004; H03M 13/3761; H03M 13/1102; H03M 13/3927
See application file for complete search history.

(56) References Cited

U.S. PATENT DOCUMENTS 4,706,249 A    11/1987   Nakagawa et al.
7,243,185 B2 *   7/2007   See ..................... G06F 12/0804
                                                           365/185.33
(Continued)

FOREIGN PATENT DOCUMENTS

JP   2005196886 A   7/2005
WO   2008121553 A1   10/2008

OTHER PUBLICATIONS

Y. Li, M. S. Rahman, S. X. Ng and B. Vucetic, "Distributed Soft Coding with a Soft Input Soft Output (SISO) Relay Encoder in Parallel Relay Channels," in IEEE Transactions on Communications, vol. 61, No. 9, pp. 3660-3672, (Year: 2010).*

(Continued)

*Primary Examiner* — Cynthia Britt
(74) *Attorney, Agent, or Firm* — Schwabe, Williamson & Wyatt, P.C.

(57) ABSTRACT

Embodiments are directed towards apparatuses, methods, and systems for a codeword distribution manager to divide a codeword into portions to be written to individual storage units and read from the corresponding different individual storage units to reduce a raw bit error rate (RBER) related to storage of the codeword. In embodiments, the codeword distribution manager is included in a memory controller and the plurality of individual storage units are coupled to the memory controller and include individual memory die or individual pages of a memory die. In embodiments, the codeword is a single codeword and includes encoded data and an error correction code. In some embodiments, the codeword includes a low density parity data check code (LDPC). Additional embodiments may be described and claimed.

18 Claims, 7 Drawing Sheets

(51) Int. Cl.
H03M 13/11 (2006.01)
H03M 13/37 (2006.01)

(52) U.S. Cl.
CPC ..... *G06F 11/1048* (2013.01); *H03M 13/1102* (2013.01); *H03M 13/3761* (2013.01); *H03M 13/3927* (2013.01)

(56) References Cited

U.S. PATENT DOCUMENTS

| | | | |
|---|---|---|---|
| 7,724,163 B2* | 5/2010 | Wong | H03M 13/2739 341/50 |
| 8,180,931 B2* | 5/2012 | Lee | G06F 3/0613 710/14 |
| 8,443,263 B2* | 5/2013 | Selinger | G06F 11/1068 714/768 |
| 8,533,550 B2 | 9/2013 | Khan | |
| 8,677,203 B1 | 3/2014 | Shalvi et al. | |
| 8,898,549 B2 | 11/2014 | Hubris et al. | |
| 8,959,407 B2 | 2/2015 | Motwani et al. | |
| 9,053,066 B2* | 6/2015 | Ramachandra | G11O 5/066 |
| 9,298,545 B2* | 3/2016 | Ratnam | G06F 11/10 |
| 2008/0256352 A1* | 10/2008 | Chow | G11C 11/5621 713/2 |
| 2009/0063934 A1 | 3/2009 | Jo | |
| 2009/0187736 A1* | 7/2009 | Raichelgauz | G06N 3/063 712/36 |
| 2011/0072328 A1 | 3/2011 | Cheng et al. | |
| 2011/0209028 A1* | 8/2011 | Post | G06F 11/1068 714/758 |
| 2011/0252289 A1 | 10/2011 | Patapoutian et al. | |
| 2011/0307758 A1 | 12/2011 | Fillingim | |
| 2012/0017139 A1 | 1/2012 | Otsuka | |
| 2012/0023384 A1 | 1/2012 | Naradasi et al. | |
| 2012/0213001 A1 | 8/2012 | Yang | |
| 2014/0122963 A1* | 5/2014 | Motwani | H03M 13/2927 714/758 |
| 2014/0122973 A1 | 5/2014 | Motwani | |
| 2014/0325316 A1* | 10/2014 | Ratnam | G06F 11/10 714/773 |
| 2014/0331003 A1* | 11/2014 | Radke | G06F 11/1068 711/103 |
| 2014/0344647 A1* | 11/2014 | Chilappagari | H03M 13/2957 714/773 |
| 2015/0178149 A1 | 6/2015 | Cai et al. | |
| 2016/0110252 A1* | 4/2016 | Hyun | G11C 29/52 714/766 |
| 2016/0291883 A1* | 10/2016 | Manohar | G06F 3/0656 |
| 2017/0199786 A1* | 7/2017 | Muralimanohar | G11C 8/10 |
| 2019/0265903 A1* | 8/2019 | Choresh | G06F 11/0727 |

OTHER PUBLICATIONS

R. Motwani and C. Ong, "Design of LDPC coding schemes for exploitation of bit error rate diversity across dies in NAND flash memory," 2013 International Conference on Computing, Networking and Communications (ICNC), San Diego, CA, 2013, pp. 950-954. (Year: 2013).*
Y. Hu, N. Xiao and X. Liu, "An elastic error correction code technique for NAND flash-based consumer electronic devices," in IEEE Transactions on Consumer Electronics, vol. 59, No. 1, pp. 1-8, Feb. 2013. (Year: 2013).*
International Search Report and Written Opinion for PCT/US2012/028763, dated Oct. 30, 2012, 7 page.
International Preliminary Report on Patentability dated Sep. 25, 2014, issued in corresponding International Application No. PCT/US2012/028763, 6 pages.
Non-Final Office Action dated May 1, 2015 for U.S. Appl. No. 13/992,851, 17 page.
Final Office Action dated Nov. 2, 2015 for U.S. Appl. No. 13/992,851, 11 page.
Extended European Search Report dated Jul. 17, 2020 for EP Application No. 20154393.1, 10 pages.

* cited by examiner

DISTRIBUTION OF A CODEWORD ACROSS INDIVIDUAL STORAGE UNITS TO REDUCE THE BIT ERROR RATE

FIELD

Embodiments of the present disclosure generally relate to the field of integrated circuits (IC), and more particularly, to error correction and data recovery techniques for solid-state memory devices

BACKGROUND

Data may be persistently stored on non-volatile memory. Error correction codes (ECC) can be used to protect the stored data from raw bit errors (the number of errors that occur before correction is applied). Original data may be encoded into a codeword. For example, a low density parity check (LDPC) codeword includes original data and parity data. An LDPC code uses information accumulated over a plurality of read operations to calculate a probability of a cell holding a 1 or a 0. Due to the fact that the LDPC codeword is typically completely stored in a single memory die, the LDPC decoder may have to mitigate the worst raw bit error rate (RBER) of the worst page of substantially all of the pages of all of the NAND dice in a solid-state drive (SSD).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
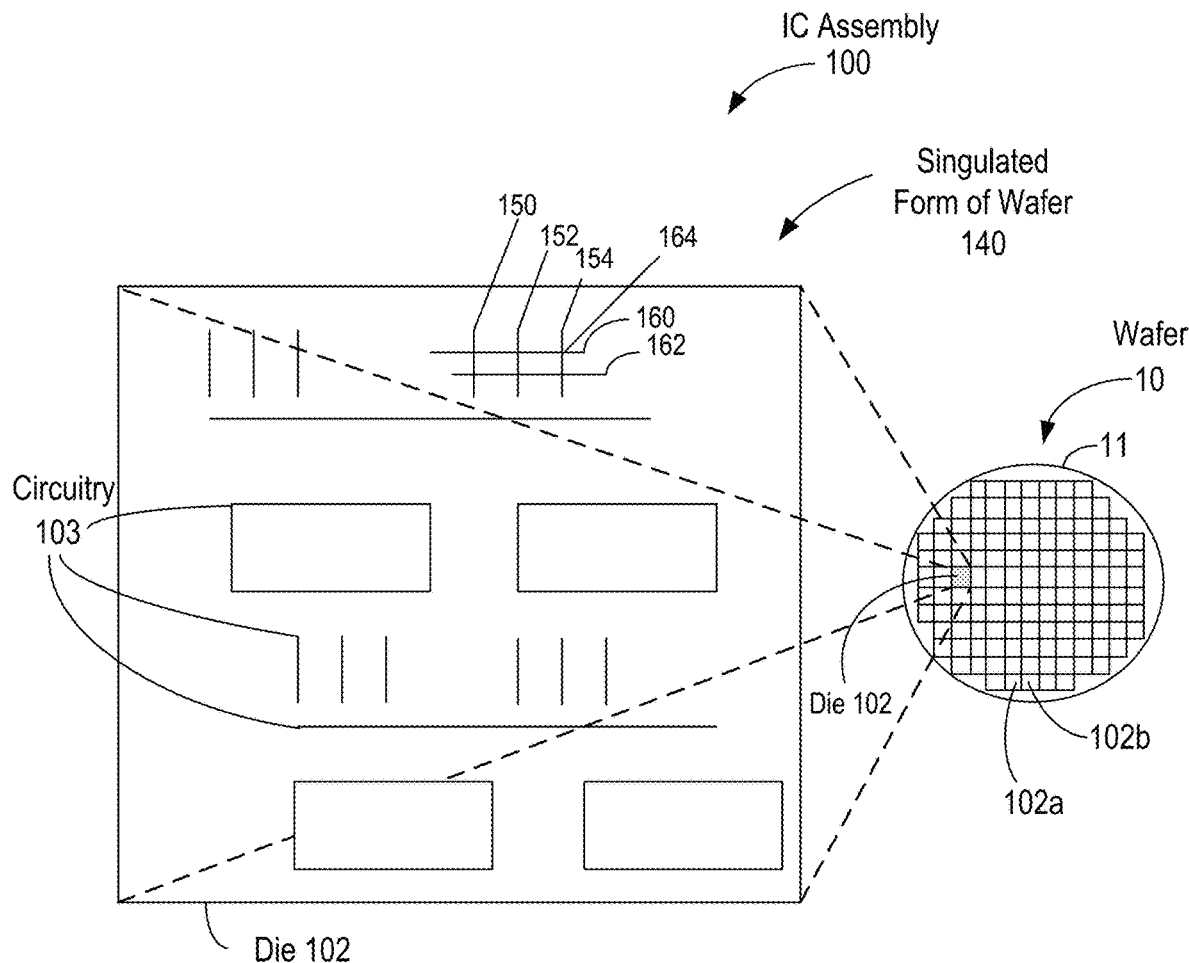
FIG. 1 illustrates an example die in which a memory device may be provided, in accordance with embodiments of the present disclosure.

Embodiments described include methods, apparatuses, and systems including a codeword distribution manager to divide a codeword into portions to be written to individual storage units and read from the corresponding individual storage units to reduce the raw bit error rate (RBER) related to storage of the codeword. In embodiments, the codeword distribution manager is included in a memory controller and the corresponding individual storage units are coupled to the memory controller and include individual memory die or individual pages of a memory die. In embodiments, the codeword includes a single codeword generated by the memory controller and includes encoded data and error correction code (ECC) information. In some embodiments, the codeword includes a low density parity data check code (LDPC). In embodiments, the RBER related to storage of the codeword is an RBER associated with storing the codeword in a single individual storage unit and to reduce the RBER includes to store the codeword across the corresponding different individual storage units associated with different RBERs.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact. In memory drives, e.g., NAND Flash memory based SSDs, an error correction (ECC) encoder may be used to generate a codeword that includes error correction information, e.g., parity bits, added to user data. Upon reading of the data, an ECC decoder is used to check and correct errors. Typically, the codeword is completely stored in a single die. As a result, when reading data, the decoder may need to decode and mitigate the raw bit errors of, e.g., a page associated with the worst RBER in an SSD. Accordingly, embodiments include apparatuses, methods, and systems directed to dividing and distributing a single code or codeword across a plurality of memory devices, e.g., memory dies or pages of memory dies (also "die(s)"). Thus, in embodiments, a decoder does not encounter, e.g., a raw bit error rate (RBER) associated with a page having a highest or worst RBER of a plurality of dies. In embodiments, the RBER is reduced due to, e.g., an RBER averaging effect over a plurality of dies.

FIG. 1 illustrates an example die in which a memory device may be provided using the techniques of the present disclosure, in accordance with some embodiments. More specifically, FIG. 1 schematically illustrates an integrated circuit assembly (IC) assembly 100 including a top view of die 102 in wafer form 10 and in singulated form 140, in accordance with some embodiments. In some embodiments, the die 102 may be one of a plurality of dies (e.g., die 102, 102a, 102b) of a wafer 11 composed of semiconductor material such as, for example, silicon or other suitable material. The plurality of dies may be formed on a surface of the wafer 11. Each of the dies may be a repeating unit of a semiconductor product that may form a memory device. For example, die 102 may include circuitry 103 and/or another memory device module or component as described herein in accordance with some embodiments. According to various embodiments, the circuitry 103 may include one or more memory elements (memory cells, such as, e.g., multi-level per cell memory cells), which may be configured in an array, such as a two-dimensional (2D) or three-dimensional (3D) non-volatile multi-level cell (MLC) memory array. In some embodiments, the memory array may comprise a 2D or 3D multi-level per cell such as three-level-per-cell (TLC) or four-level-per-cell (QLC) NAND memory array. In some embodiments, the memory array comprises a cross-point memory array.

The circuitry 103 may further include one or more wordline(s) (also referred to as "WL" or "WLs") (e.g., 150, 152, 154) and one or more bitline(s) (also referred to as "BL" or "BLs") (e.g., 160, 162) coupled to the memory elements. Only three wordlines and two bitlines are shown in FIG. 1 for ease of understanding. In some embodiments, the bitlines and wordlines may be configured such that each of the memory elements may be disposed at an intersection (e.g., 164) of each individual bitline and wordline (e.g., 160 and 154), in a cross-point configuration. A voltage or bias can be applied to a target memory element of the memory elements using the wordlines and the bitlines to select the target memory cell for a read or write operation. Bitline drivers may be coupled to the bitlines and wordline drivers may be coupled to the wordlines to facilitate decoding/selection of the memory elements. To enable memory cell selection, the wordlines 150, 152, 154 may be connected with memory cells and other parts of circuitry 103 via interconnects, including respective contact structures (e.g., vias) that provide electrical connectivity through the layers of the die 102 as described below in greater detail. It is noted that the circuitry 103 is only schematically depicted in FIG. 1 and may represent a wide variety of suitable logic or memory in the form of circuitry or other suitable devices and configurations including, for example, one or more state machines including circuitry and/or instructions in storage (e.g., firmware or software) configured to perform actions such as read, program, verify and/or analysis operations in connection with data portion allocation for temperature management of memory devices as described herein.

In some embodiments, circuitry 103 may be formed using suitable semiconductor fabrication techniques, some of which are described herein. After a fabrication process of the semiconductor product is complete, the wafer 11 may undergo a singulation process in which each of the dies (e.g., die 102) may be separated from one another to provide discrete "chips" of the semiconductor product. The wafer 11 may be any of a variety of sizes. According to various embodiments, the circuitry 103 may be disposed on a semiconductor substrate in wafer form 10 or singulated form 140. In some embodiments, the die 102 may include memory that include corresponding individual storage units to store a portion of a codeword in accordance with embodiments described further below.

Figure 2:
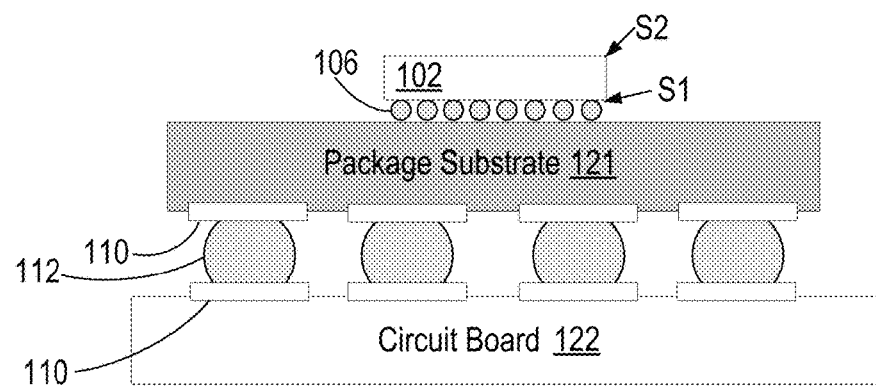
FIG. 2 schematically illustrates a cross-section side view of an integrated circuit (IC) assembly that may be included in a memory device, in accordance with embodiments of the present disclosure.

FIG. 2 schematically illustrates a cross-section side view of an example integrated circuit (IC) assembly 200 that may be included in a memory device provided in accordance with some embodiments described herein. In some embodiments, the IC assembly 200 may include one or more dies electrically and/or physically coupled with a package substrate 121. The die 102 may include circuitry (e.g., circuitry 103 of FIG. 1) and/or other suitable components or modules to perform operations in connection with temperature management of a memory device as described herein. In some embodiments, the package substrate 121 is coupled with a circuit board 122, as shown.

The IC assembly 200 may include a wide variety of configurations including, for example, suitable combinations of flip-chip and/or wire-bonding configurations, interposers, multi-chip package configurations including System in Package (SiP) and/or Package on Package (PoP) configurations. For example, the die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, memory elements as described in reference to FIG. 1. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate 121 using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures, fabrication of some of which is described below.

In some embodiments, the package substrate 121 may comprise an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

In some embodiments, the package substrate 121 may be coupled with a circuit board 122, as can be seen. The circuit board 122 may be a printed circuit board (PCB) composed of an electrically insulative material such as an epoxy laminate. For example, the circuit board 122 may include electrically insulating layers composed of materials that may be laminated together. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 may be a motherboard and may be included in a computing device, such as, for example, a mobile device. Package-level interconnects such as, for example, solder balls 112 may be coupled to pads 110 on the package substrate 121 and/or on the circuit board 122 to form corresponding solder joints that may be configured to further route the electrical signals between the package substrate 121 and the circuit board 122. The pads 110 may be composed of any suitable electrically conductive material such as metal. The package-level interconnect may include other structures and/or configurations including, for example, land-grid array (LGA) structures and the like. In embodiments, the die 102 of the IC assembly 200 may be, include, or be a part of an IC included in a memory device, such as, e.g., a memory device that includes a plurality of individual storage units (e.g., individual memory die 102 and/or pages of the individual memory die 102) to store a codeword, wherein each of the individual storage units is associated with a raw bit error rate (RBER) related to storage of the codeword, in accordance with embodiments. In embodiments, the memory device is coupled to a processor (e.g., in a memory controller) that divides the codeword into portions, and each portion is to be written to a different individual storage unit and read from the corresponding different individual storage units to reduce an RBER related to storage of the codeword.

Figure 3:
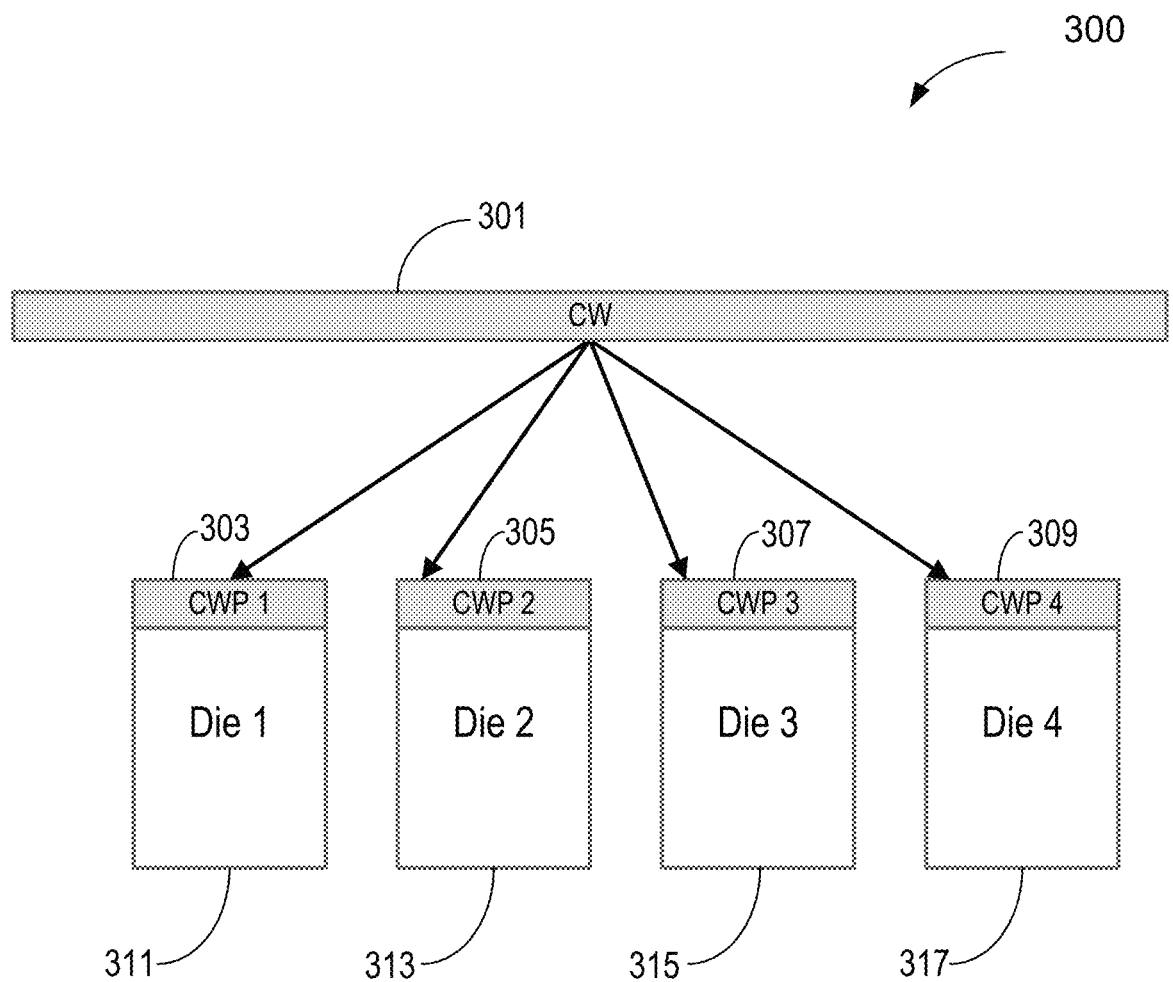
FIG. 3 is a block diagram illustrating division of an example codeword into portions to reduce a raw bit error rate (RBER) related to storage of the codeword, in accordance with embodiments of the present disclosure.

FIG. 3 is an example block diagram illustrating division of an example codeword, according to some embodiments. In embodiments, codeword 301 is, e.g., a single codeword generated by, e.g., an ECC engine of a memory controller and includes encoded data and error correction information, such as an error correction code (ECC). In embodiments, codeword 301 includes any suitable error correction information or ECC that is used to assist in correcting errors in memory devices. For example, in some embodiments, codeword 301 includes a low density parity data check code (LDPC). In other embodiments, the codeword may be a Bose-Chaudhuri-Hocquenghtem (BCH) codeword.

In the example of FIG. 3, a codeword distribution manager of, e.g., a memory controller, divides a codeword into four portions, a codeword portion 1 (CWP1) 303, a codeword portion 2 (CWP2) 305, a code word portion 3 (CWP3) 307, and a codeword portion 4 (CWP4) 309. In embodiments, each portion is to be written to a different individual storage unit and read from the corresponding different individual storage units to reduce a bit error rate (BER), e.g., raw bit error rate (RBER) related to storage of the codeword. In the embodiment of FIG. 3, the individual storage units are individual memory die, however, in similar or same embodiments, are also individual pages of an individual memory die. Accordingly, as shown, CWP1 303 is written to (and subsequently read from) a die 1 311, CWP2 305 is written to (and subsequently read from) a die 2 313, CWP3 307 is written to (and subsequently read from) a die 3 315, and CWP4 309 is written to (and subsequently read from) a die 4 317.

Accordingly, in embodiments, each of CWP1 303, CWP2 305, CWP3 307, and CWP4 309 is written to a different individual storage unit and read from the corresponding different individual storage units to reduce the BER related to storage of the codeword. In embodiments, an RBER associated with storage of the codeword is reduced due to an RBER averaging effect over the corresponding different individual storage units. Although in the embodiment shown, codeword 301 is divided into four codeword portions, a codeword may be divided into any suitable number of portions to reduce the RBER associated with storage of the codeword. In embodiments, the codeword is divided into any suitable number of portions where the division is based at least in part upon an average throughput desired and/or average RBER of the corresponding different individual storage units. In various embodiments, a single codeword read may include parallel reads from multiple memory die.

Furthermore, in various embodiments, a codeword, e.g., codeword 301, is divided in any suitable manner, proportion, or distribution of data (e.g., user data bits) and/or error correction information (ECC or parity bits) to reduce an RBER related to storage of the codeword when stored in corresponding different individual storage units.

Figure 4:
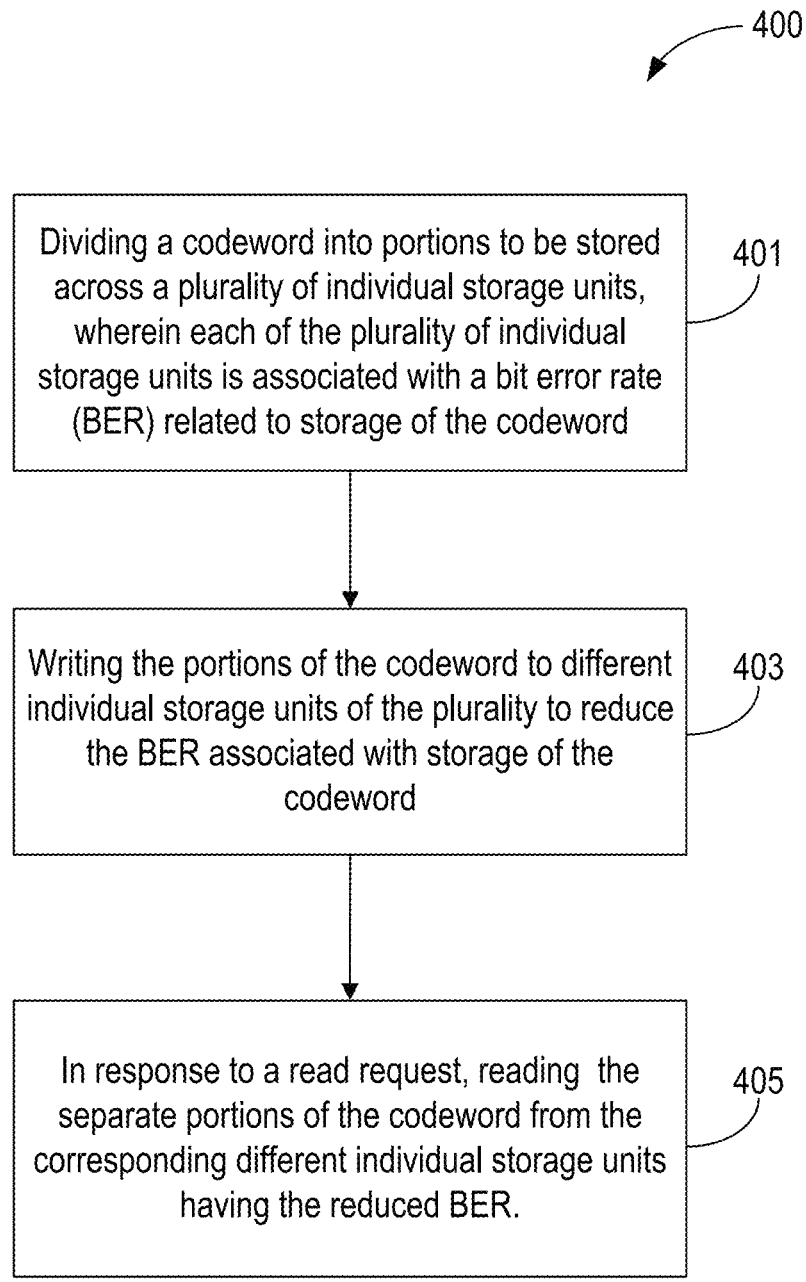
FIG. 4 is a flow diagram associated with embodiments of FIG. 3, in accordance with embodiments of the present disclosure.

FIG. 4 is a flow diagram 400 illustrating an example process that is performed by a codeword distribution manager operable by a processor or processor of, e.g., a memory controller, in accordance with embodiments of the present disclosure. In embodiments, beginning at a block 401, the codeword distribution manager divides a codeword into portions to be stored across a plurality of individual storage units. Due to variances in the storage units, e.g., variances in each of the memory die or memory page of memory die, each of the plurality of individual storage units is associated with a bit error rate (BER), e.g. RBER, related to storage of the codeword. For example, storage of an example codeword, e.g., codeword 301, in die 1 311 of FIG. 3 may be associated with an RBER as high as $5.0 \times 10^{-3}$. In the same example, storage of codeword 301 may be associated with an RBER of, e.g., $3.5 \times 10^{-3}$ in die 2 313, while storage of codeword 301 in die 3 315 may be associated with an RBER of e.g., $2.5 \times 10^{-3}$ and storage of codeword 301 in die 4 417 may be associated with an RBER of, e.g., $1.7 \times 10^{-3}$.

In embodiments, at a next block 403, the codeword distribution manager writes the portions of the codeword (e.g., CWP1 303, CWP2 305, CWP3 307, and CWP4 309 of FIG. 3) to different individual storage units (e.g., die 1 311, die 2 313, die 3 315, die 4 317) of the plurality to reduce the RBER associated with storage of the codeword. Next, at a block 405, in response to a read request, the codeword distribution manager reads separate portions of the codeword from the corresponding different individual storage units. In embodiments, an RBER associated with storage of the codeword across the individual storage units has been reduced relative to storage of the codeword in an individual storage unit having a high RBER. For example, storage of the codeword RBER may associated with an average of the RBER of the four individual storage units, e.g., $3.175 \times 10^{-3}$.

Note that in some embodiments, where the corresponding individual storage units include different memory die, the memory die are located in memory devices coupled to a same physical memory channel. In other embodiments, the memory die may be located in different physical memory channels. In some embodiments, a memory controller performs one or more independent read operations to read the portions of the codeword from the corresponding different individual storage units.

Figure 5:
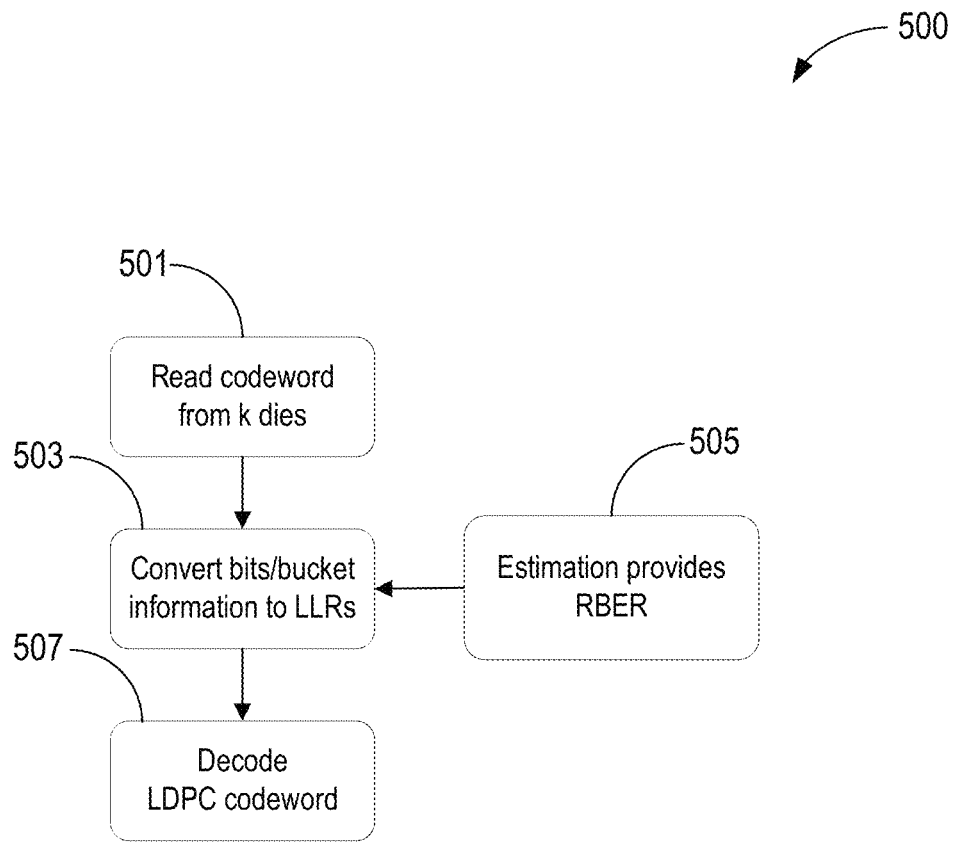
FIG. 5 is a flow diagram associated with embodiments of FIGS. 3 and 4, in accordance with embodiments of the present disclosure.

FIG. 5 is a flow diagram 500 illustrating an example process, which may be implemented by a memory controller and/or constituent portions of memory controller, in accordance with embodiments of the present disclosure. For example, the process 500 can comprise an ECC engine executed by the memory controller. As noted above, a codeword may include different types of error correction codes according to embodiments of the disclosure. In some embodiments, a low-density party-check (LDPC) code uses information to determine a likelihood of a memory cell containing a bit value of 1 or 0. In embodiments, the likelihood or probability of a particular cell containing a 0 or a 1 may be represented by a log likelihood ratio (LLR), given a particular threshold voltage range. Accordingly, in embodiments, at a block 501, a decoder, e.g. LDPC decoder reads a codeword from corresponding different individual storage units, e.g., k memory dies or k memory pages. Note that in embodiments the LDPC decoder decodes a codeword according to several stages. In various embodiments, the decoder at block 501 performs hard decoding in a first stage of LDPC decoding, where the controller reads the data using the read reference voltages or optimal read reference voltages. At a next block 503, in embodiments, the decoder uses information obtained from the multiple read operations and converts bin/bucket information pertaining to storage units to corresponding log likelihood ratios (LLR's). Note that in embodiments, LLR's represent a probability of a certain bit being a 0 or a 1. In embodiments, new information about a memory cell is used to determine the LLR, e.g., an estimation of an RBER for the memory die, e.g., at block 505. In embodiments, the RBER associated with storage of the codeword has been reduced according to embodiments described in connection with FIGS. 3-5. In embodiments, firmware of a memory controller provides a die-wise estimate of the RBER. In some embodiments, the estimate is determined from physical channel information related to the die(s) or pages of die(s).

Accordingly, as noted above with respect to FIG. 5, in embodiments, the codeword is a low density parity check (LDPC) codeword, the BER is a raw BER (RBER) and the codeword distribution manager further comprises an LDPC decoder to receive an estimation of a distributed raw bit error rate (RBER) to determine a probability of an error. In embodiments, as will be seen in FIG. 6, a processor is included in a memory controller and the estimation of a distributed or reduced raw bit error rate (RBER) is determined by firmware of the memory controller and provided to the LDPC decoder to allow the LDPC decoder to determine an LLR of a bit of the codeword. In embodiments, the LDPC decoder receives bin information (bin categorization information) related to a memory cell to convert the bin information to a log likelihood ratio (LLR) of a bit of the codeword. Note that flow diagram 500 has been simplified and various operations have been omitted in order to avoid obscuring embodiments of the disclosure.

Figure 6:
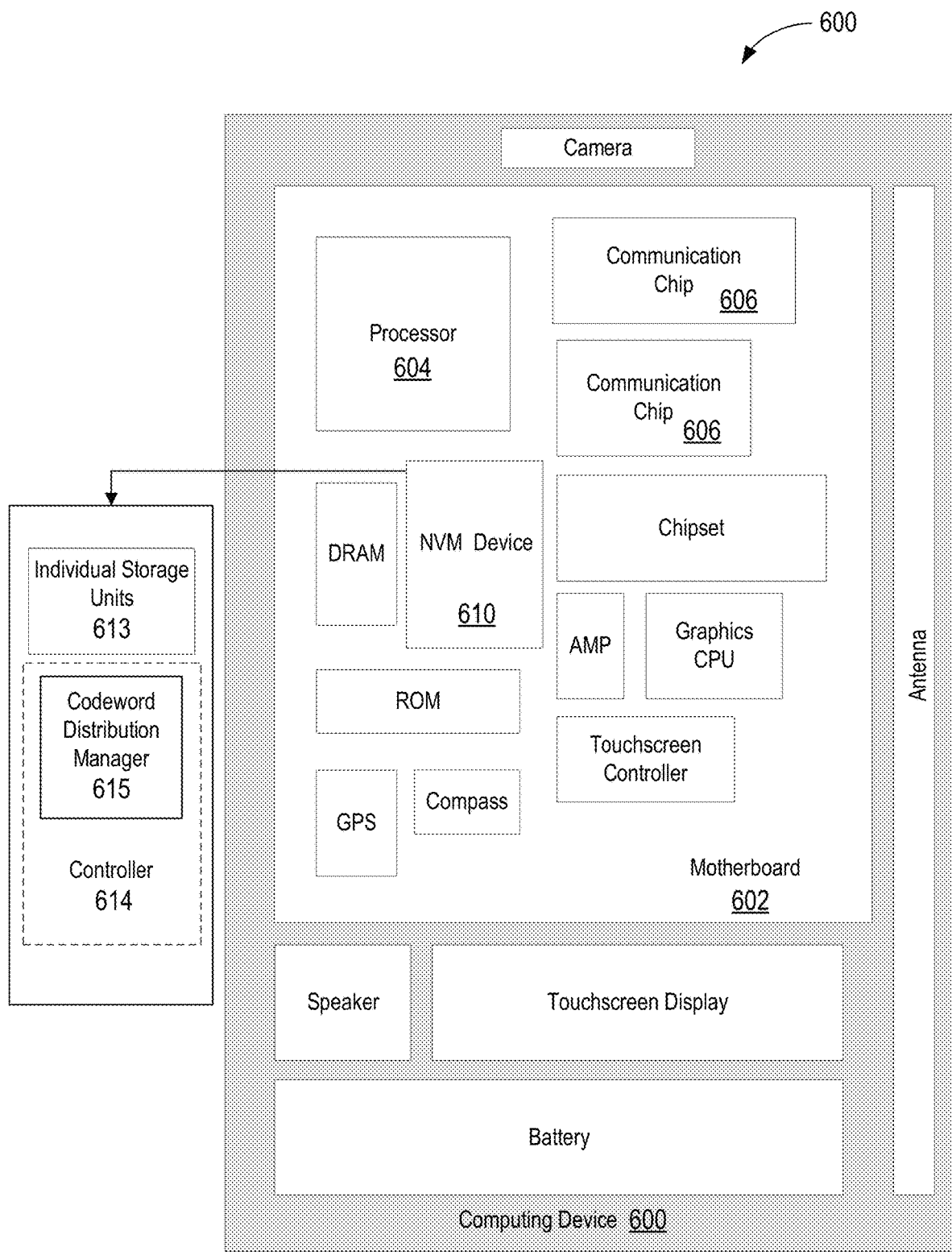
FIGS. 6 and 7 are diagrams of computing systems associated with embodiments of FIGS. 3-5, in accordance with embodiments of the present disclosure.
Figure 7:
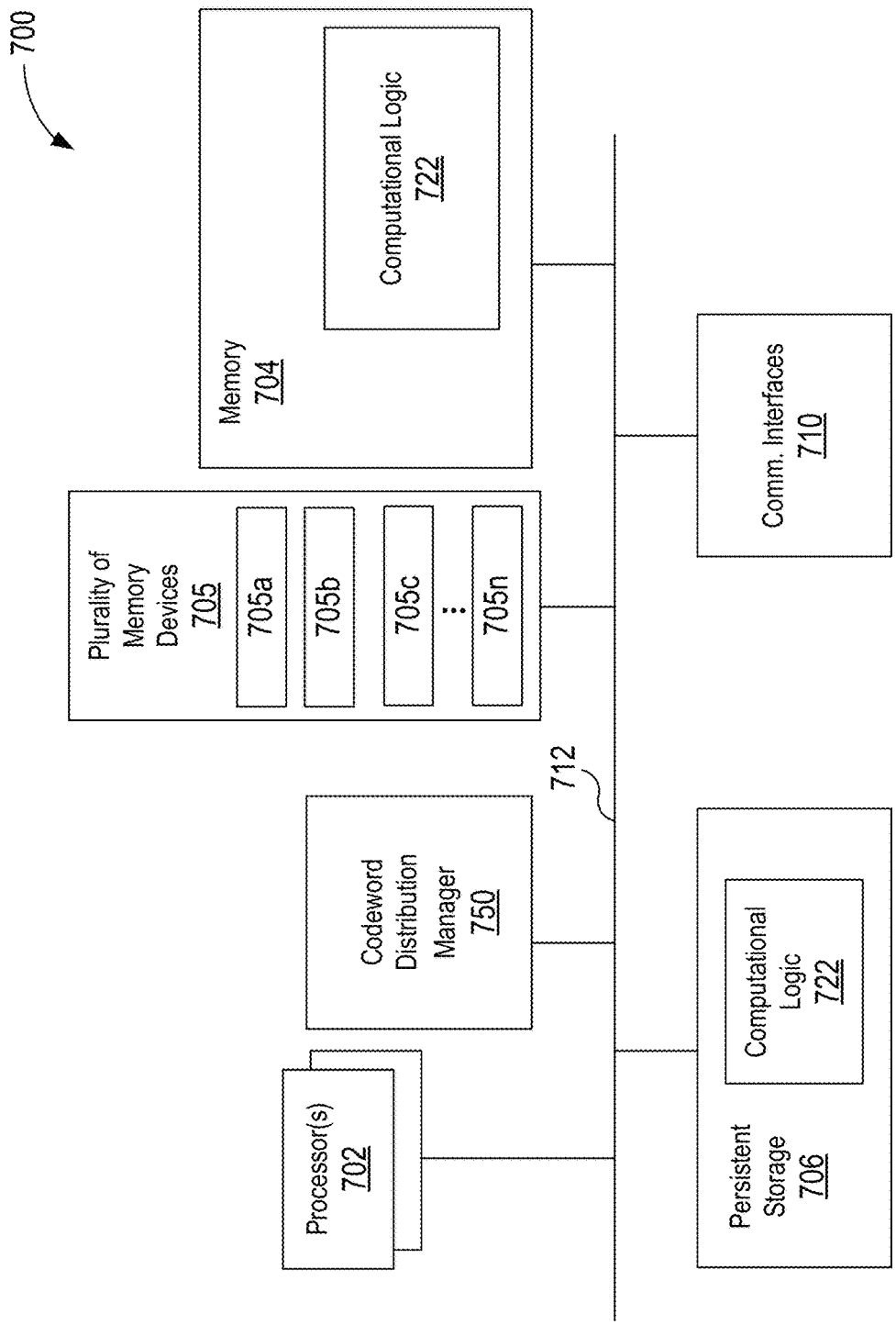

FIG. 6 illustrates an example computer system or computer device 600 that may include components corresponding to and/or implementing various components and methods of FIGS. 3-5, such as a codeword distribution manager 615 and a plurality of different individual storage units to store a portion of a codeword to reduce an RBER related to storage of the codeword, in accordance with various embodiments.

In embodiments, computing device 600 includes a memory device (e.g., a non-volatile memory device (NVM) 610) in accordance with various embodiments of the present disclosure. In embodiments, computing device 600 houses a board 602, such as, for example, a motherboard. The board 602 may include a number of components, including but not limited to a processor 604 and at least one communication chip 606. The processor 604 is physically and electrically coupled to the board 602. In some implementations, the at least one communication chip 606 is also physically and electrically coupled to the board 602. In further implementations, the communication chip 606 is part of the processor 604.

Accordingly, in some embodiments, NVM 610 is, e.g., a solid state-drive (SSD), including individual storage units. In embodiments, NVM 610 includes NAND flash SSDs and includes, e.g., individual storage units 613 which include NAND flash memory dies and/or pages of the NAND flash memory dies. In some embodiments, the SSDs include 3D XPOINT™ memory devices. In embodiments, individual storage units 613 are coupled to a controller 614. As shown, controller 614 includes codeword distribution manager 615 (and/or circuitry) that are operable and/or included in controller 614 to perform operations in connection with operations as described in connection with FIGS. 3-5. Accordingly, in embodiments, the plurality of individual storage units are to store a codeword and each of the individual storage units is associated with a bit error rate (BER) related to storage of the codeword. In embodiments, the codeword distribution manager is be operated by a processor of controller 614 to divide the codeword into separate portions, wherein each portion is to be written to a different individual storage unit of the plurality and read from the corresponding different individual storage units to distribute or reduce the BER related to storage of the codeword across the plurality of individual storage units.

Accordingly noted above, the one or more memory devices includes one or more memory chips and the plurality of individual storage units includes a plurality of memory die, wherein each portion of the divided codeword is written to a different memory die. In various embodiments, the plurality of individual storage units includes a plurality of memory pages within one or more memory die and wherein each portion of the divided codeword is written to a different memory page of the one or more memory die. In embodiments, the system is a solid state memory drive (SSD) (e.g., FIG. 8) and the processor is included in a flash memory controller of the SSD.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die, e.g., die described in connection with the above embodiments, packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Computer device 700 includes a codeword distribution manager 750 coupled to a plurality of memory devices including a plurality of individual storage units 705a-705n to store a portion of a codeword according to some embodiments described above. In embodiments, computer device 700 includes any computing system that utilizes memory or storage devices having multiple channels, e.g., enterprise computing systems to mobile devices. In embodiments, persistent storage 706 and memory 704 also may include a plurality of memory devices including, e.g., plurality of individual storage units 705a-705n. Accordingly, in some embodiments, plurality of memory devices includes a plurality of solid-state memory drives (SSD) to store a portion of a codeword according to some embodiments described above. In some embodiments, plurality of memory devices include 3D XPOINT™ memory devices. The computer device 700 may further include communication interfaces 710 (such as network interface cards, modems, infrared receivers, radio receivers (e.g., Bluetooth), and so forth). The communication interfaces 710 may include communication chips (not shown) that may be configured to operate the computer device 700 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 710 may operate in accordance with other wireless protocols in other embodiments. In some embodiments, the communication interfaces 710 may operate in accordance with one or more wired networking protocols. In some embodiments, the communication interfaces 710 may operate via one or more LAN ports and/or one or more WAN ports.

The above-described computer device 700 elements may be coupled to each other via system bus 712, which may represent one or more buses. In the case of multiple buses, they may be bridged by one or more bus bridges (not shown). Each of these elements may perform its conventional functions known in the art. In particular, system memory 704 and persistent storage devices 706 may be employed to store a working copy and a permanent copy of the programming instructions, such as drivers, for the operation of various components of computer device 700, an operating system of computer device 700 (and/or one or more applications, collectively referred to as computational logic 722. The various elements may be implemented by assembler instructions supported by processor(s) 702 or high-level languages that may be compiled into such instructions. In some embodiments, computational logic 722 includes codeword distribution manager. The permanent copy of the programming instructions may be placed into persistent storage devices 706 in the factory or in the field through, for example, a distribution medium (not shown), such as a compact disc (CD), or through communication interface 710 (from a distribution server (not shown)). That is, one or more distribution media having an implementation of the agent program may be employed to distribute the agent and to program various computing devices.

For some embodiments, at least one of processors 702 may be packaged together with a storage medium having all or portions of computational logic 722 configured to facilitate aspects of embodiments described herein to form a System in Package (SiP) or a System on Chip (SoC).

In various embodiments, a data decoder/encoder (not shown) coupled to bus 712 of a gateway may comprise a coder-decoder (codec) configured to encode, decode or transcode video data in accordance with a Motion Picture Experts Group-2 (MPEG-2), H.264 Advanced Video Coding (H264/AVC), H.265 High Efficiency Coding (H265/HEVC), VP9, VC-1 or Motion JPEG (MJPEG) video compression standard or any other suitable video compression standard.

In various implementations, the computing device 700 may be a data center, a laptop, a netbook, a notebook, an ultrabook, a smartphone, a tablet, a personal digital assistant (PDA), an embedded computer device, an ultra mobile PC, a mobile phone, a desktop computer, a server, a printer, a scanner, a monitor, a set-top box, an entertainment control unit, a digital camera, or a digital video recorder. In further implementations, the computing device 700 may be any other electronic device that processes data.

Figure 8:
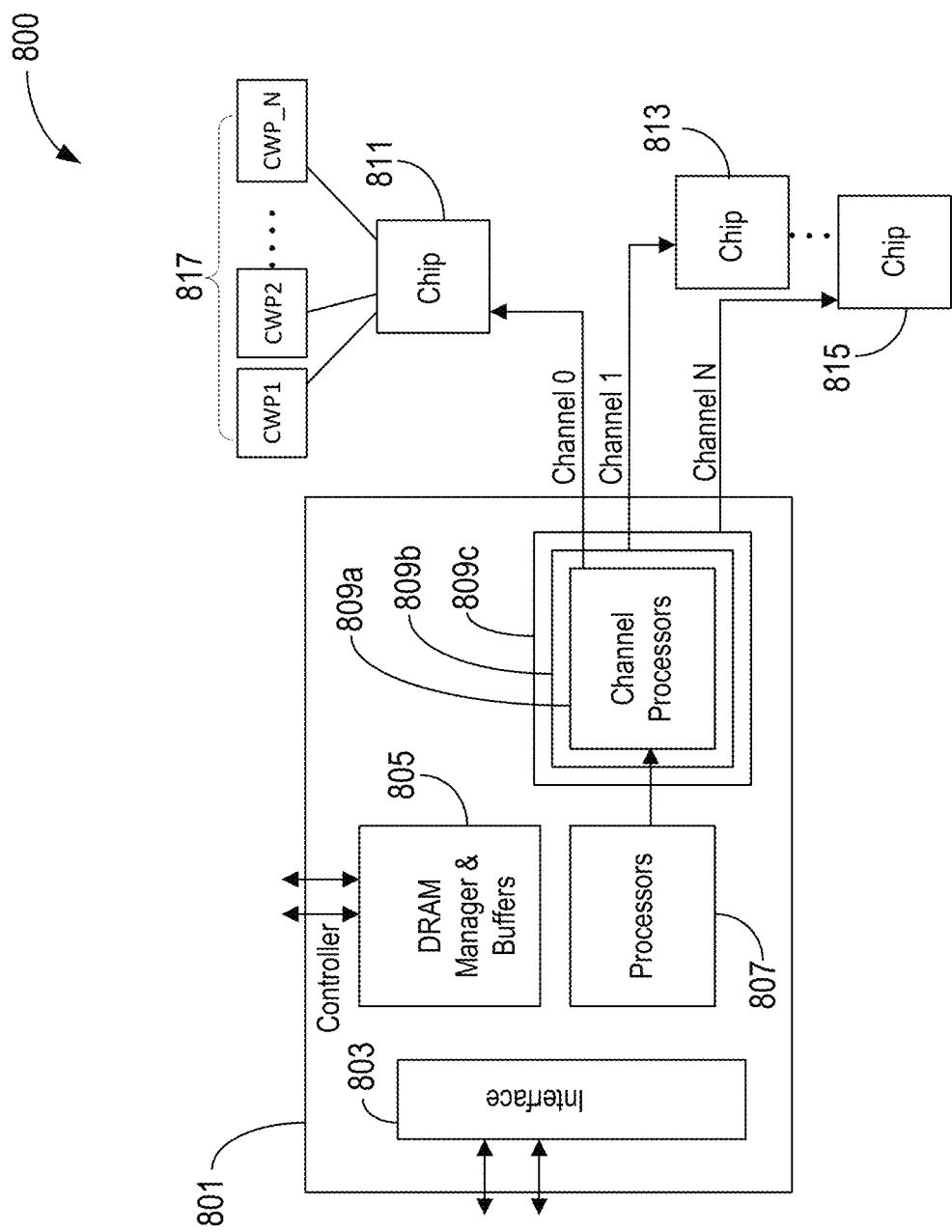
FIG. 8 illustrates an example memory device that includes a plurality of individual storage units to store a portion of a codeword in connection with embodiments described in FIGS. 3-7.

FIG. 8 illustrates an example SSD 800 that includes a plurality of individual storage units to store a portion of a codeword in connection with embodiments described in FIGS. 3-7. For example, as shown in the embodiment, SSD 800 includes a controller 801 including an interface 803 to a host (not shown), DRAM manager and buffers 805, one or more processors 807, channel processors 809*a*, 809*b*, 809*c*, coupled to corresponding chips, e.g., 811, 813, and 815 via channels, e.g., channel 0, channel 1, and channel N. In embodiments, chip 811 includes a plurality of individual storage units 817 to store a portion of a codeword, e.g., CWP1, CWP2, and CWP_N. Note that in some embodiments (not shown), a codeword is divided into only two portions of codeword, e.g., CWP1 and CWP2. Note that SSD 800 is only an example embodiment. Furthermore, that various components of SSD 800 are omitted for clarity in the FIGS and that in embodiments, SSD 800 may include more or less components than as illustrated. Each of these elements may perform its conventional functions known in the art in addition to the functions associated with embodiments described according to the present disclosure.

According to various embodiments, the present disclosure describes a number of examples.

Example 1 is an apparatus, comprising: a processor to couple to a memory device, wherein the memory device includes a plurality of individual storage units to store a codeword, wherein each of the individual storage units is associated with a bit error rate (BER) related to storage of the codeword; and a codeword distribution manager to be operated by the processor to divide the codeword into portions, wherein each portion is to be written to a different individual storage unit and read from the corresponding different individual storage units to reduce the BER related to storage of the codeword.

Example 2 is the apparatus of Example 1, wherein the bit error rate (BER) is a raw bit error rate (RBER) and the RBER related to storage of the codeword is an RBER associated with storing the codeword in a single individual storage unit and to reduce the RBER includes to store the codeword across the corresponding different individual storage units associated with different RBERs.

Example 3 is the apparatus of Example 1, wherein the apparatus is a memory controller and the plurality of individual storage units include individual memory die or individual pages of a memory die.

Example 4 is the apparatus of Example 3, wherein the codeword is a single codeword generated by the memory controller and includes encoded data and an error correction code.

Example 5 is the apparatus of Example 1, wherein the codeword includes a low density parity data check code (LDPC).

Example 6 is the apparatus of Example 1, wherein the apparatus is a memory controller and is to perform one or more independent read operations to read the portions of the codeword from the corresponding different individual storage units.

Example 7 is the apparatus of Example 1, wherein the codeword distribution manager is to divide the codeword into the separate portions in response to a write request.

Example 8 is the apparatus of any one of Examples 1-7, wherein the memory device is a 3D NAND flash memory device.

Example 9 is a method, comprising dividing by a memory controller, a codeword into portions to be stored across a plurality of individual storage units, wherein each of the plurality of individual storage units is associated with a bit error rate (BER) related to storage of the codeword; writing, by the memory controller, the portions of the codeword to different individual storage units of the plurality to reduce the BER associated with storage of the codeword; and in response to a read request, reading by the memory controller, the separate portions of the codeword from the corresponding different individual storage units having the reduced BER.

Example 10 is the method of Example 9, wherein writing, by the memory controller, the portions of the codeword to different individual storage units includes writing each of the portions of the codeword to corresponding individual memory dies or individual memory pages of a single memory die.

Example 11 is the method of Example 10, wherein the codeword comprises an error correction codeword that includes encoded data and a parity correction code.

Example 12 is the method of Example 11, wherein the error correction codeword is a low density parity data check codeword (LDPC).

Example 13 is the method of Example 11, wherein the error correction codeword is a Bose-Chaudhuri-Hocquenghtem (BCH) codeword.

Example 14 is the method of Example 9, wherein reading by the memory controller, the separate portions of the codeword includes performing one or more independent read operations to read portions of the codeword from the corresponding different individual storage units.

Example 15 is the method of Example 10, wherein reading by the memory controller, the separate portions of the codeword includes performing one or more independent read operations from corresponding different individual storage units coupled to different physical memory channels.

Example 16 is the method of Example 9, wherein the BER is a raw bit error rate (BER) related to storage of the codeword.

Example 17 is the method of any one of Examples 9-16, wherein codeword distribution manager is to divide the codeword into the separate portions in response to a write request.

Example 18 is an apparatus comprising means for performing the method of any one of Examples 9-17 or some other example herein.

Example 19 is a system, comprising a processor; one or more memory devices coupled to the processor, wherein the one or more memory devices includes a plurality of individual storage units to store a codeword and each of the individual storage units is associated with a bit error rate (BER) related to storage of the codeword; and a codeword distribution manager to be operated by the processor to divide the codeword into separate portions, wherein each portion is to be written to a different individual storage unit of the plurality and read from the corresponding different individual storage units to distribute the BER related to storage of the codeword across the plurality of individual storage units.

Example 20 includes the system of Example 19, wherein the one or more memory devices includes one or more memory chips and the plurality of individual storage units includes a plurality of memory pages, wherein each portion of the divided codeword is written to a different memory die.

Example 21 includes the system of Example 19, wherein the plurality of individual storage units includes a plurality of memory pages within one or more memory die and wherein each portion of the divided codeword is written to a different memory page of the one or more memory die.

Example 22 includes the system of Example 19, wherein the system is a solid state memory drive (SSD) and the processor is included in a flash memory controller of the SSD.

Example 23 includes the system of Example 19, wherein the codeword is a low density parity check (LDPC) codeword, the BER is a raw BER (RBER) and the codeword distribution manager further comprises an LDPC decoder to receive an estimation of a distributed raw bit error rate (RBER) to determine a probability of an error Example 24 includes the system of any one of Examples 19-23, wherein the processor is included in a memory controller and the estimation of a distributed raw bit error rate is determined by firmware of the memory controller and provided to the LDPC decoder to allow the LDPC decoder to determine a log likelihood ratio (LLR) of a bit of the codeword.

Example 25 includes the system of Example 24, wherein the LDPC decoder receives bin information related to a memory cell to convert the bin information to a log likelihood ratio (LLR) of a bit of the codeword.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. An apparatus, comprising:
a processor to couple to a memory device, wherein the memory device includes a plurality of individual storage units to store a codeword, wherein each of the individual storage units is a page of a memory die and the page is associated with a bit error rate (BER); and
a codeword distribution manager to be operated by the processor to divide the codeword into portions, wherein each portion is to be written to a different page of the memory die and read from corresponding different pages of the memory die to reduce the BER related to storage of the codeword in the page of the memory die, wherein to read a portion of the codeword from corresponding different pages of the memory die includes to receive information about a memory cell determined from updated physical channel information related to the page of the memory die and to use the updated physical channel information, after performing a hard decoding of the codeword, to determine a probability of an error in the memory cell via a log likelihood ratio (LLR) of a bit of the codeword stored in the memory cell.

2. The apparatus of claim 1, wherein the bit error rate (BER) is a raw bit error rate (RBER) and the RBER related to storage of the codeword is an RBER associated with storing the codeword in a single individual storage unit and to reduce the RBER includes to store the codeword across the corresponding different individual storage units associated with different RBERs.

3. The apparatus of claim 1, wherein the apparatus is a memory controller.

4. The apparatus of claim 3, wherein the codeword is a single codeword generated by the memory controller and includes encoded data and an error correction code.

5. The apparatus of claim 1, wherein the codeword includes a low density parity data check code (LDPC).

6. The apparatus of claim 1, wherein the apparatus is a memory controller and is to perform one or more independent read operations to read the portions of the codeword from the corresponding different individual storage units.

7. The apparatus of claim 1, wherein the codeword distribution manager is to divide the codeword into the separate portions in response to a write request.

8. The apparatus of claim 1, wherein the memory device is a 3D NAND flash memory device.

9. A method, comprising:
Dividing, by a memory controller, a codeword into portions to be stored across a plurality of individual storage units, wherein each of the plurality of individual storage units is a page of a memory die and the page is associated with a bit error rate (BER);
writing, by the memory controller, the portions of the codeword to different individual pages of the memory die to reduce the BER associated with storage of the codeword in a corresponding page of the memory die; and in response to a read request, reading by the memory controller, the separate portions of the codeword from corresponding different pages having the reduced BER, wherein to read a portion of the codeword from the corresponding different pages includes to receive information about a memory cell determined from updated physical channel information related to the corresponding page of the memory die and to use the updated physical channel information, after performing a hard decoding of the codeword, to determine a probability of an error in the memory cell via a log likelihood ratio (LLR) of a bit of the codeword stored in the memory cell.

10. The method of claim 9, wherein the codeword comprises an error correction codeword that includes encoded data and a parity correction code.

11. The method of claim 10, wherein the error correction codeword is a low density parity data check codeword (LDPC).

12. The method of claim 9, wherein reading, by the memory controller, the separate portions of the codeword includes performing one or more independent read operations to read portions of the codeword from the corresponding different individual storage units.

13. A system, comprising:

a processor;

one or more memory devices coupled to the processor, wherein the one or more memory devices includes a plurality of individual storage units to store a codeword and each of the individual storage units is a page of a memory die and the page is associated with a bit error rate (BER); and a codeword distribution manager to be operated by the processor to divide the codeword into separate portions, wherein each portion is to be written to a different page of the memory die and read from the corresponding different pages of the memory die to reduce the BER associated with the page of the memory die, wherein to read a portion of the codeword from corresponding different pages of the memory die includes to receive information about a memory cell determined from updated physical channel information related to the page of the memory die and to use the updated physical channel information, after performing a hard decoding of the codeword, to determine a probability of an error in the memory cell via a log likelihood ratio (LLR) of a bit of the codeword stored in the memory cell.

14. The system of claim 13, wherein the one or more memory devices includes one or more memory chips.

15. The system of claim 13, wherein the system is a solid state memory drive (SSD) and the processor is included in a flash memory controller of the SSD.

16. The system of claim 13, wherein the codeword is a low density parity check (LDPC) codeword, the BER is a raw BER (RBER) and the codeword distribution manager further comprises an LDPC decoder to receive an estimation of a distributed raw bit error rate (RBER) to determine a probability of an error.

17. The system of claim 16, wherein the processor is included in a memory controller and the estimation of a distributed raw bit error rate is determined by firmware of the memory controller and provided to the LDPC decoder to allow the LDPC decoder to determine a log likelihood ratio (LLR) of a bit of the codeword.

18. The system of claim 17, wherein the LDPC decoder receives bin information related to a memory cell to convert the bin information to the log likelihood ratio (LLR) of a bit of the codeword.

\* \* \* \* \*